United States Patent
Kwong et al.

(10) Patent No.: US 6,559,703 B1
(45) Date of Patent: May 6, 2003

(54) BI-DIRECTIONAL UNDERSHOOT-ISOLATING BUS SWITCH WITH DIRECTIONAL CONTROL

(75) Inventors: David Kwong, Fremont, CA (US); Eddie Siu Yam Chan, Milpitas, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 503 days.

(21) Appl. No.: 09/607,460

(22) Filed: Jun. 29, 2000

(51) Int. Cl.[7] ................. H03K 19/0175; H03K 19/0944
(52) U.S. Cl. .................. 327/313; 327/389; 361/111
(58) Field of Search .................. 327/310, 313, 327/328, 389, 391, 434, 437, 581; 326/30, 86, 21; 361/88, 90, 91.1, 92, 111; 365/72, 198, 203

(56) References Cited

U.S. PATENT DOCUMENTS

| | | | |
|---|---|---|---|
| 4,988,902 A | 1/1991 | Dingwall | 327/382 |
| 5,289,062 A | 2/1994 | Wyland | 327/389 |
| 5,442,304 A | 8/1995 | Wong et al. | 326/17 |
| 5,550,412 A | 8/1996 | Anneser | 307/125 |
| 5,673,277 A | 9/1997 | Amitai et al. | 714/726 |
| 5,751,168 A | 5/1998 | Speed, III et al. | 326/83 |
| 5,808,502 A * | 9/1998 | Hui et al. | 327/333 |
| 5,896,417 A | 4/1999 | Lau | 375/258 |
| 5,952,849 A | 9/1999 | Haigh | 326/82 |
| 5,963,080 A | 10/1999 | Miske et al. | 327/534 |
| 6,034,553 A | 3/2000 | Kwong | 326/86 |
| 6,052,019 A | 4/2000 | Kwong | 327/437 |
| 6,100,719 A * | 8/2000 | Graves et al. | 326/86 |
| 6,320,408 B1 * | 11/2001 | Kwong | 326/86 |

* cited by examiner

Primary Examiner—Timothy P. Callahan
Assistant Examiner—Terry L. Englund
(74) Attorney, Agent, or Firm—Stuart T. Auvinen (57) ABSTRACT

A bus switch is protected from undershoots on either of its terminals. The bus switch transistor is an n-channel metal-oxide-semiconductor (MOS) with its source connected to a first bus and its drain connected to a second bus. During isolation, the gate node of the bus switch transistor is discharged to ground by a pulsed transistor, and then kept at ground by a leaker transistor. Sense-pulse circuits are attached to the first and second bus. When a low-going transition is detected by a sense-pulse circuit, an n-channel connecting transistor is turned on, connecting the bus with the low-going transition to the gate node through a grounded-gate n-channel transistor. If an undershoot occurs, it is coupled to the gate node. Since both the gate and source of the bus switch transistor are coupled to the undershoot, the gate-to-source voltage never reaches the transistor threshold and the bus switch transistor remains off. An external direction signal may also be used to pre-activate the connecting transistor for one of the two sides of the bus switch transistor, replacing the sense-pulse circuits.

20 Claims, 7 Drawing Sheets

FIG. 1

PRIOR ART

BI-DIRECTIONAL UNDERSHOOT-ISOLATING BUS SWITCH WITH DIRECTIONAL CONTROL

FIELD OF THE INVENTION

This invention relates to semiconductor bus switches, and more particularly to bi-directional undershoot protection for a MOS bus switch.

BACKGROUND OF THE INVENTION

Networkinig applications often employ bus switches. Bus switches using metal-oxide-semiconductor (MOS) technology have the advantage of low on resistance, reducing delay through the switch. The source and drain nodes of the bus-switch transistor connect to the busses while the gate is controlled by a bus-conecting enable signal. See for example "Parallel Micro-Relay Bus Switch for Computer Network Communication with Reduced Crosstalk and Low On-Resistance using Charge Pumps", U.S. Pat. No. 5,808, 502, and "Bus Switch Having Both P- and N-Channnel Transistors for Constant Impedance Using Isolation Circuit for Live-Insertion when Powered Down" U.S. Ser. No. 09/004,929, now U.S. Pat. No. 6,034,553.

More complex networks are emerging. For example, the bus switch may connect two processor buses. Each processor bus can operate independently of the other. Hot-plugging or hot-swapping of cards with the processor bus can also occur. When the bus switch is in the isolation mode, full isolation must occur, regardless of which bus is active.

Figure 1:
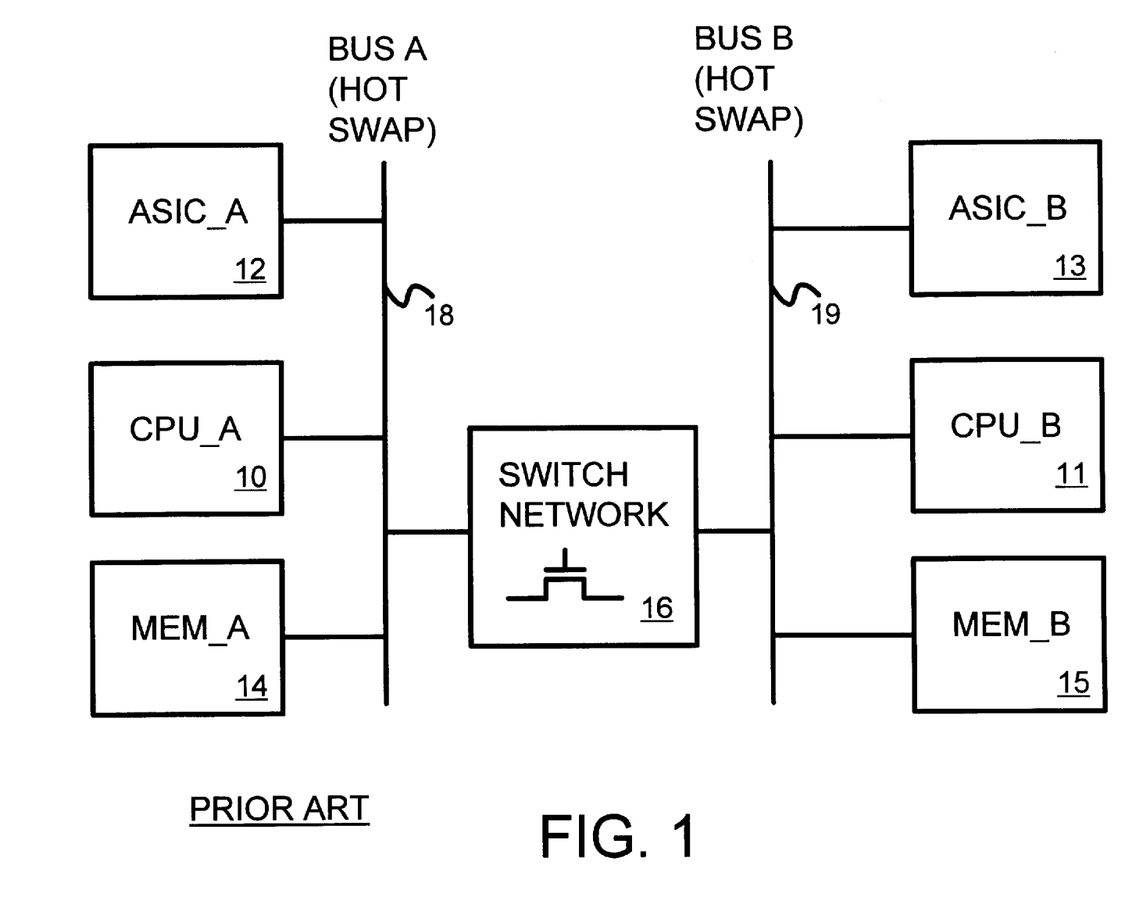
FIG. 1 shows a typical application of a bus switch.

FIG. 1 shows a typical application of a bus switch. First local bus signals 18 (bus A) is connected to CPU_A 10, memory_A 14, and Application-Specific Integrated Circuit (ASIC_A) 12. Second local bus signals 19 (bus B) is a second local bus that has CPU_B 11, memory_B 15, and Application-Specific Integrated Circuit (ASIC_B) 13. Second local bus signals 19 is a hot-plugable bus. Switch network 16 connects address, data, and control lines from bus signals 18 to bus signals 19 using MOS transistors. One transistor is used for each bus signal.

When a device is plugged into bus signals 19, it may be desired to isolate bus signals 19 from local bus signals 18. Noise caused by the plugging operation can then be isolated to bus signals 19, allowing local bus signals 18 to operate unhindered. Switch network 16 can isolate bus signals 19 from local bus signals 18 by applying a low voltage to n-channel transistors in switch network 16. When switch network 16 isolates, Bus_A can operate independently of Bus_B.

Either Bus_A or Bus_B may be hot-plugged into the other bus. This allows for repair of systems without any downtime. Isolation by switch network 16 must therefore be fully bi-directional since it is not known which bus will be replaced until a failure occurs.

Undershoot Problem

When an n-channel transistor is used as the bus switch, the bus switch is disabled by driving a ground voltage to the gate of the n-channel bus-switch transistor. The output bus signal should be isolated from voltage changes at the input bus signal. The quality of the signal waveforms on local bus signal 18 is not always well controlled. Sometime large voltage spikes below ground (undershoots) occur, especially on the high-to-low transitions from high-current drivers on local bus signal 18. The same could occur on bus signals 19.

When the bus-switch input from bus signal 18 goes below ground, a positive gate-to-source voltage develops on bus-switch transistor since its gate is at ground. A conducting channel forms below the gate. When the undershoot is greater than a volt, this gate-to-source voltage exceeds the n-channel threshold voltage, turning on the n-channel bus switch transistor. Some current is conducted through the channel of the bus-switch transistor even though its gate may be kept at ground. The result is that the voltage is disturbed on the drain of the bus-switch transistor, and the output to bus 19.

When the source of the n-channel bus-switch transistor goes negative during the undershoot, the base-emitter junction of the parasitic lateral NPN transistor is forward biased, coupling more current to the output through the p-type substrate.

The result of the undershoot is that the output connects to the input for a short period of time, the duration of the undershoot. The voltage on the drain of the bus-switch transistor can quickly fall from the power supply (Vcc) to ground and even below ground should the undershoot last for more than a few nanoseconds. The undershoots on the input bus coupled to the output, producing severe voltage disturbances on the isolated bus.

The co-inventor has solved an undershoot-isolation problem in an earlier patent, U.S. Pat. No. 6,052,019 for "Undershoot-Isolating MOS Bus Switch". However, this patent shows a circuit that is effective when the undershoot always occurs on only one side of the bus switch. An improved circuit is desired that can isolate undershoots that would occur on either side of the bus switch. A fully bidirectional undershoot-isolating bus switch is desired.

What is desired is a fully bidirectional bus switch using CMOS technology. Protection from undershoot on the input or output side is desired when the bus switch is isolating its output from its input. An active undershoot-protection circuit using CMOS transistors is desired. It is desired to maintain the low on-resistance and low capacitance of the bus switch. A more fully-isolating and bi-directional bus switch is desirable.

SUMMARY OF THE INVENTION

A bi-directional-undershoot-protected bus switch has a first bus input connected to a first bus and a second bus input connected to a second bus. A bus switch transistor has a source connected to the first bus input and a drain connected to the second bus input and a gate connected to a gate node.

A first connecting transistor has a source connected to the first bus input and a drain connected to a first intermediate node. It connects the first bus input to the first intermediate node in response to a first activating signal applied to a first activating node connected to a gate of the first connecting transistor. A first fixed-gate transistor has a source connected to the first immediate node and a drain connected to the gate node and a gate connected to a fixed voltage. It connects the first intermediate node to the gate node during an undershoot on the first bus input.

A second connecting transistor has a source connected to the second bus input and a drain connected to a second intermediate node. It connects the second bus input to the second intermediate node in response to a second activating signal applied to a second activating node connected to a gate of the second connecting transistor. A second fixed-gate transistor has a source connected to the second immediate node and a drain connected to the gate node and a gate connected to a fixed voltage. It connects the second intermediate node to the gate node during an undershoot on the second bus input.

A first activating transistor has a drain connected to the first activating node. It generates the first activating signal to protect from the undershoot on the first bus input. A second activating transistor has a drain connected to the second activating node. It generates the second activating signal to protect from the undershoot on the second bus input.

An enable input is for indicating an isolation mode when the bus switch transistor isolates the first bus input from the second bus input. A pullup transistor has a gate responsive to the enable input. It drives the gate node high when the isolation mode is not active. A discharge transistor drives the gate node low when the isolation mode begins. Thus the bus switch transistor is protected from undershoots on the first and second bus inputs.

In further aspects of the invention the first and second fixed-gate transistors are n-channel transistors with gates connected to ground. The fixed voltage is ground. Thus grounded-gate transistors couple the undershoot to the gate node.

In further aspects the first and second connecting transistors are n-channel transistors. The first activating transistor is a p-channel transistor having a drain connected to the first activating node and a source connected to a power supply and a gate connected to a first trigger node. The second activating transistor is a p-channel transistor having a drain connected to the second activating node and a source connected to the power supply and a gate connected to a second trigger node. Thus p-channel transistors generate the first and second activating signals.

In further aspects of the invention a first sense-pulse circuit is coupled to the first bus input. It generates a pulse on the first trigger node in response to a low-going transition on the first bus input. A second sense-pulse circuit is coupled to the second bus input. It generates a pulse on the second trigger node in response to a low-going transition on the second bus input. Thus undershoot protection is triggered by low-going transitions on the first and second bus inputs.

In other aspects of the invention a direction input indicates when the first bus input is active and the second bus input is inactive. A first logic gate receives the direction input and the enable input; it drives the first trigger node. A second logic gate receives the direction input and the enable input. It drives the second trigger node. The direction input disables either the first activating transistor or the second activating transistor. Thus undershoot protection is enabled by logic gates selected by the direction input.

DETAILED DESCRIPTION

The present invention relates to an improvement in bus switches. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that bi-directional active protection circuits can be added to a MOS bus switch to protect against undershoots when the bus switch is isolating. These active protection circuits connect the gate of the n-channel bus switch transistor to the input when the input goes below ground. Likewise, the substrate can be connected to the input when the input falls below ground.

The inventors have also realized that a pulse circuit can be employed to enable the protection circuit only during high-to-low transitions of the input. Another pulse circuit can be used to enable protection during transitions on the output side. Thus noise on the input or output at other times does not accidentally trigger the protection circuit. Bi-directional protection is provided.

The protection circuit can be enabled either with a directional control circuit or with a sensing and pulse circuit. The directional control circuit uses an external input that indicates which bus is active. The sensing and pulse circuit requires no such external input. Instead, undershoots are detected and trigger a pulse that enables the protection circuit.

Figure 2:
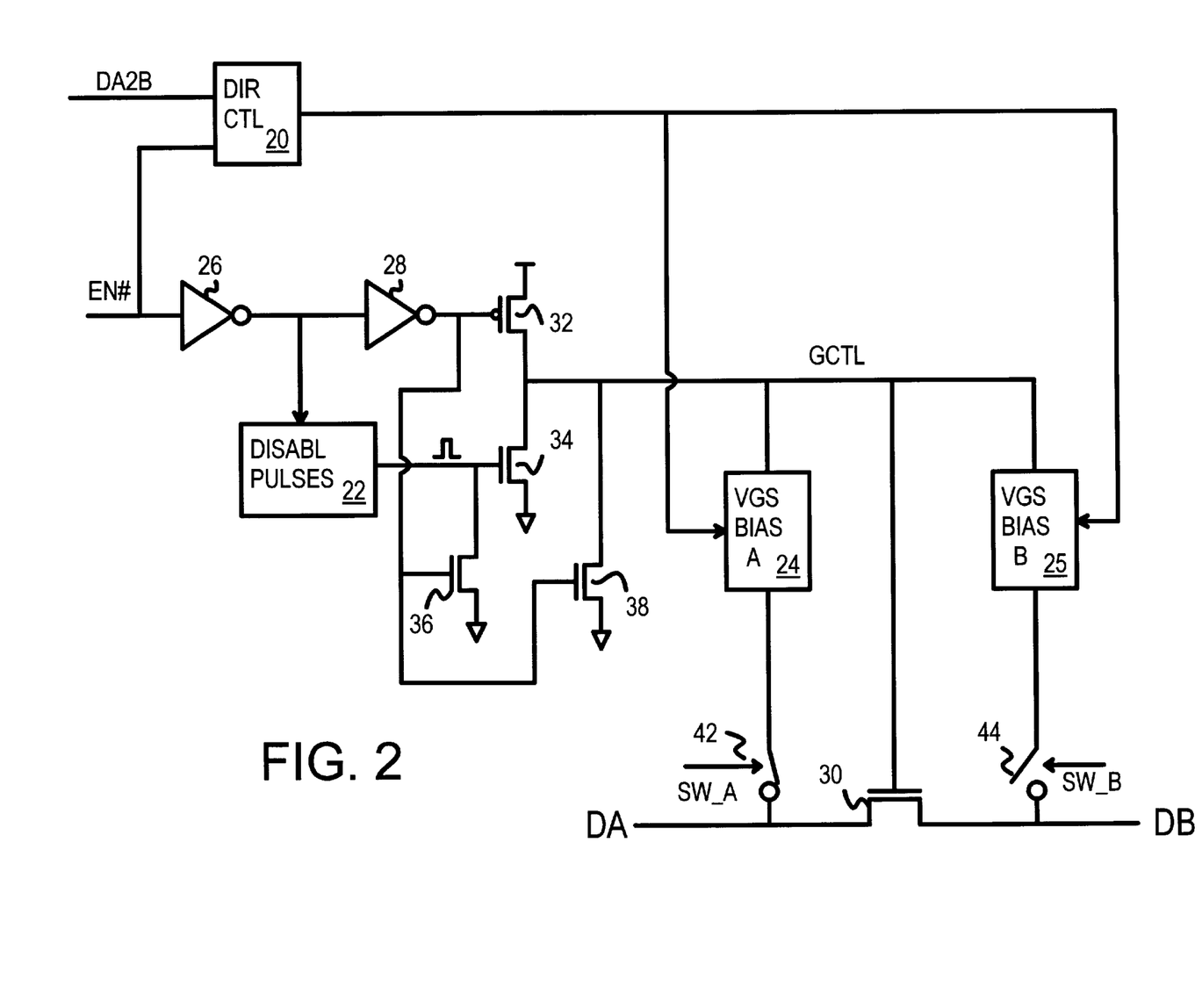
FIG. 2 is a block diagram of a bus switch with undershoot protection that uses explicit directional control.

Protection Using Directional Control—FIG. 2

FIG. 2 is a block diagram of a bus switch with undershoot protection that uses explicit directional control. Two external control signals are inputted. Isolation signal EN# is low when bus switch transistor 30 connects bus signal DA to bus signal DB. Isolation signal EN# goes high when bus switch transistor 30 is to isolate bus signals DA, DB. Isolation occurs by turning off bus switch transistor 30 by driving a low to gate-control node GCTL, which is the gate of bus switch transistor 30.

The other control signal is direction signal DA2B. Direction signal DA2B is high when bus DA is active, but low when bus DB is active. When both buses are active, signal DA2B can be either high or low.

An external system controller normally generates direction signal DA2B and isolation signal EN#. For example, when both busses DA, DB are operating normally, isolation signal EN# is low. When a failure occurs on bus DB, isolation signal EN# is driven high to isolate DB, and direction signal DA2B is set high since is bus DA still in active operation. When a failure occurs on bus DA, isolation signal EN# is driven high to isolate DA, and direction signal DA2B is set low since bus DB is still in active operation.

Directional control circuit 20 combines direction signal DA2B and isolation signal EN#. Directional control circuit 20 enables one of gate-bias circuits 24, 25 and closes one of switches 42, 44 during isolation. Directional control circuit 20 thus enables protection for one side of bus switch transistor 30 but disables protection for the other side during isolation.

When enabled during an undershoot below ground, gate-bias circuits 24, 25 drive gate node GCTL below ground with the lower voltage of the undershoot. This prevents the gate-to-source voltage of bus switch transistor 30 from rising above the transistor threshold voltage. Bus switch transistor 30 is therefore prevented from turning on during the undershoot.

For example, when isolation signal EN# is high and direction signal DA2B is high, switch 42 is closed and gate-bias circuit 24 is enabled. Switch 44 is open and gate-bias circuit 25 is disabled. When an undershoot occurs on bus DA, switch 42 couples the undershoot to gate-bias circuit 24. Gate-bias circuit 24 then couples the undershoot voltage to gate node GCTL, driving the gate voltage below ground. The gate-to-source voltage of bus switch transistor 30 is then limited to prevent turn-on.

Undershoot protection is provided for only one side of bus switch transistor 30, since it is assumed that the other side is not active. For example, when direction signal DA2B is high during isolation, only bus DA is allowed to be active. Bus DB is assumed to be off, so that undershoots are not generated. For hot-plugging applications, when a system is inserted into bus DA, undershoot transients generated on DA do not disturb DB. When both buses are active, isolation of undershoots from one bus to the other is not useful since any undershoots are overpowered by the active signals driven onto the buses.

When isolation mode begins, isolation signal EN# is driven from low to high and inverted by inverters 26, 28. A high-going pulse is generated by pulse generator 22, which drives the gate of discharge transistor 34. The gate node GCTL is discharged to ground by discharge transistor 34, thus turning off bus switch transistor 30, isolating bus DA from bus DB. The high isolation signal EN# turns off p-channel pullup transistor 32 that normally drives a high onto gate node GCTL when bus switch transistor 30 is enabled.

Keeper transistor 36, 38 have their gates driven high by inverter 28 when isolation signal EN# is high. Keeper transistor 36 keeps the gate of discharge transistor 34 low after the pulse ends, while keeper transistor 38 keeps gate node GCTL at ground when no undershoots occur during isolation. Keeper transistors 36, 38 have long channel lengths so that other active transistor can overpower them, such as the transistors in gate-bias circuit 24 that drive gate node GCTL below ground during an undershoot.

Figure 3:
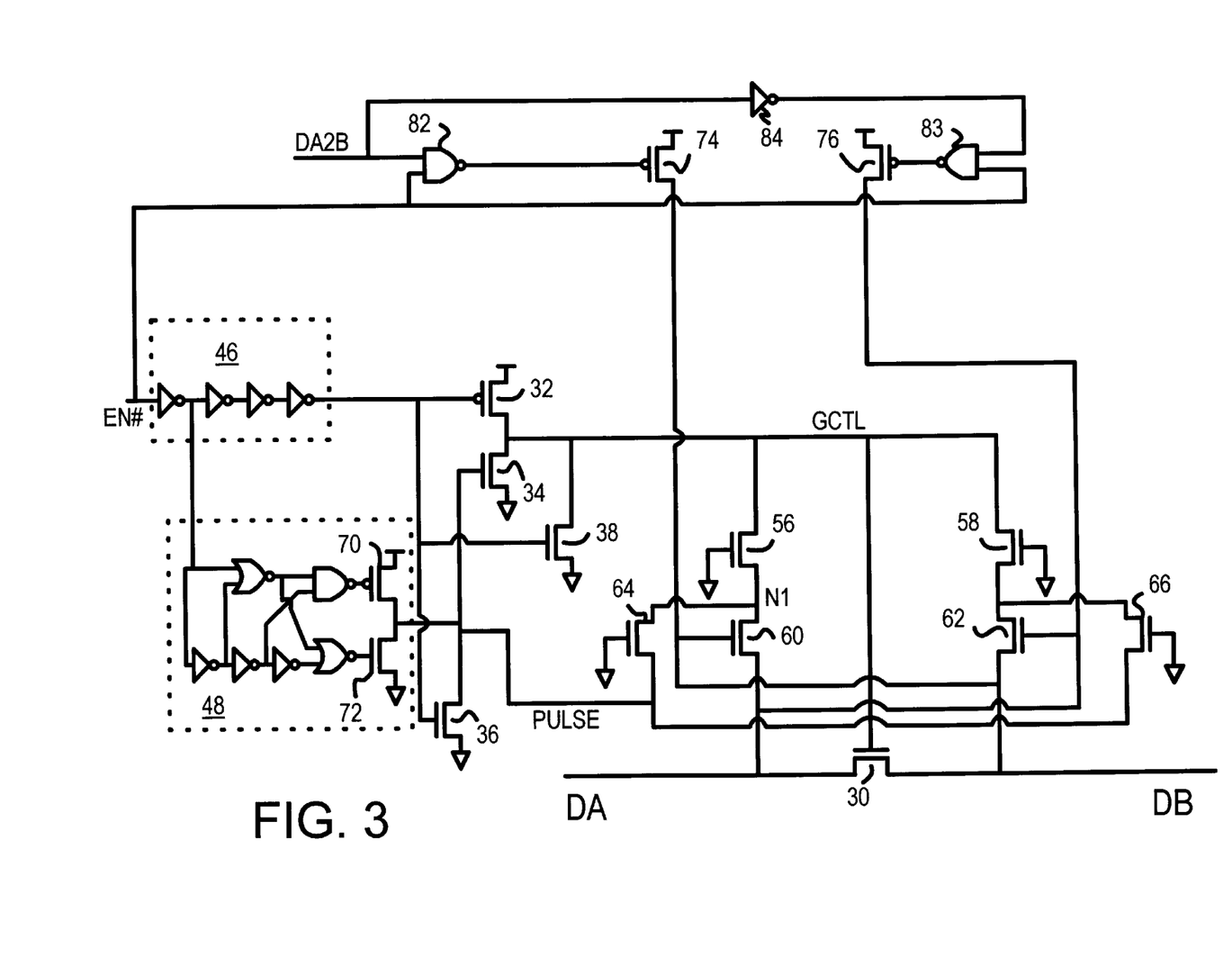
FIG. 3 is a detailed schematic of a bus switch with undershoot protection that uses explicit directional control.

FIG. 3 is a detailed schematic of a bus switch with undershoot protection that uses explicit directional control. Bus signal DA is connected to bus signal DB through the channel of bus switch transistor 30. When the bus switch is enabled, isolation signal EN# is low and four inverters 46 drive a low to the gate of p-channel pullup transistor 32. Gate node GCTL is driven high by p-channel pullup transistor 32. Keeper transistors 36, 38 are held off by four inverters 46. Grounded-gate n-channel transistors 56, 58 are turned off when gate node GCTL is high. Thus gate node GCTL is driven only by p-channel pullup transistor 32 when isolation signal EN# is low and bus switch transistor 30 is enabled.

When isolation signal EN# is low, NAND gates 82, 83 output a high to the gates of p-channel transistors 74, 76, turning them off. While connecting n-channel transistors 60, 62 turn on when DA or DB is high, their drains are isolated from other circuitry by grounded-gate n-channel transistors 56, 58, 64, 66.

When isolation mode is entered, isolation signal EN# goes high. Four inverters 46 drives a high to the gate of p-channel pullup transistor 32, turning it off. Keeper transistors 36, 38 are turned on, providing a low-current sink on gate node GCTL and pulse node PULSE.

Pulse generator 48 generates a high-going pulse on node PULSE, using p-channel pullup 70 and n-channel pulldown 72. This pulse turns on n-channel discharge transistor 34, which pulls gate node GCTL to ground. This turns off bus switch transistor 30, isolating bus DA from bus DB. Once the pulse ends, keeper transistor 38 keeps gate node GCTL at ground despite any leakage currents. The pulse on node PULSE is not passed through grounded-gate transistors 64, 66 even though the pulse is applied to their drains.

The high isolation signal EN# allows NAND gates 82, 83 to pass direction signal DA2B or its inverse from inverter 84 through to p-channel transistors 74, 76. One of p-channel transistors 74, 76 is turned on while the other is off, depending on direction signal DA2B.

For example, when DA2B is high (DA is active and DB is off), NAND gate 82 outputs a low to p-channel transistor 74, turning it on, while NAND gate 83 outputs a high to p-channel transistor 76, keeping it off. P-channel transistor 74 has its drain connected to bus signal DB, and acts as a pullup for the inactive bus signal DB. Also, the drain of p-channel transistor 74 is connected to the gate of n-channel connecting transistor 60, turning on the connecting transistor. This enables the undershoot protection circuit for the active bus DA, while the undershoot protection for bus DB is off. Furthermore transistors 74, 76 are weak pull-ups. They do not interfere with normal bus activities when enabled.

When an undershoot below ground occurs on active bus DA, the left side of bus switch transistor 30 becomes its source. Connecting transistor 60 is on, and couples the undershoot to node N1. Grounded-gate transistor 56 then turns on, since its source is node N1, which is pulled below ground by the undershoot on DA coupled through connecting transistor 60. Grounded-gate transistor 56 then pulls gate node GCTL below ground. This keeps the gate-to-source voltage of bus switch transistor 30 from rising above the transistor threshold of about 0.5 volt. Grounded-gate transistors 64, 66 can also turn on, pulling node PULSE below ground. This couples the negative undershoot potential to node PULSE, preventing discharge transistor 34 from turning on. Also, keeper transistor 38 is merely a weak pull-down, so it does not disturb the negative potential at GCTL; this node remains negative during the undershoot. However, since connecting transistor 62 is held off by p-channel transistor 76, the undershoot is not coupled to bus DB. Isolation is maintained during the undershoot on bus DA.

When the undershoot ends, the current through grounded-gate transistor 56 reverses direction. Gate node GCTL is charged back up toward ground through grounded-gate transistor 56 and connecting transistor 60 as bus DA ends the undershoot and returns to ground. Once gate node GCTL is at −0.5 volt, grounded-gate transistor 56 shuts off. Keeper transistor 38 then conducts current in a reverse direction by sourcing current from ground until gate node GCTL reaches ground.

The substrate of all n-channel transistors is preferrably connected to a back bias, such as −2 or −3 volt. This enhances undershoot protection.

Figure 4:
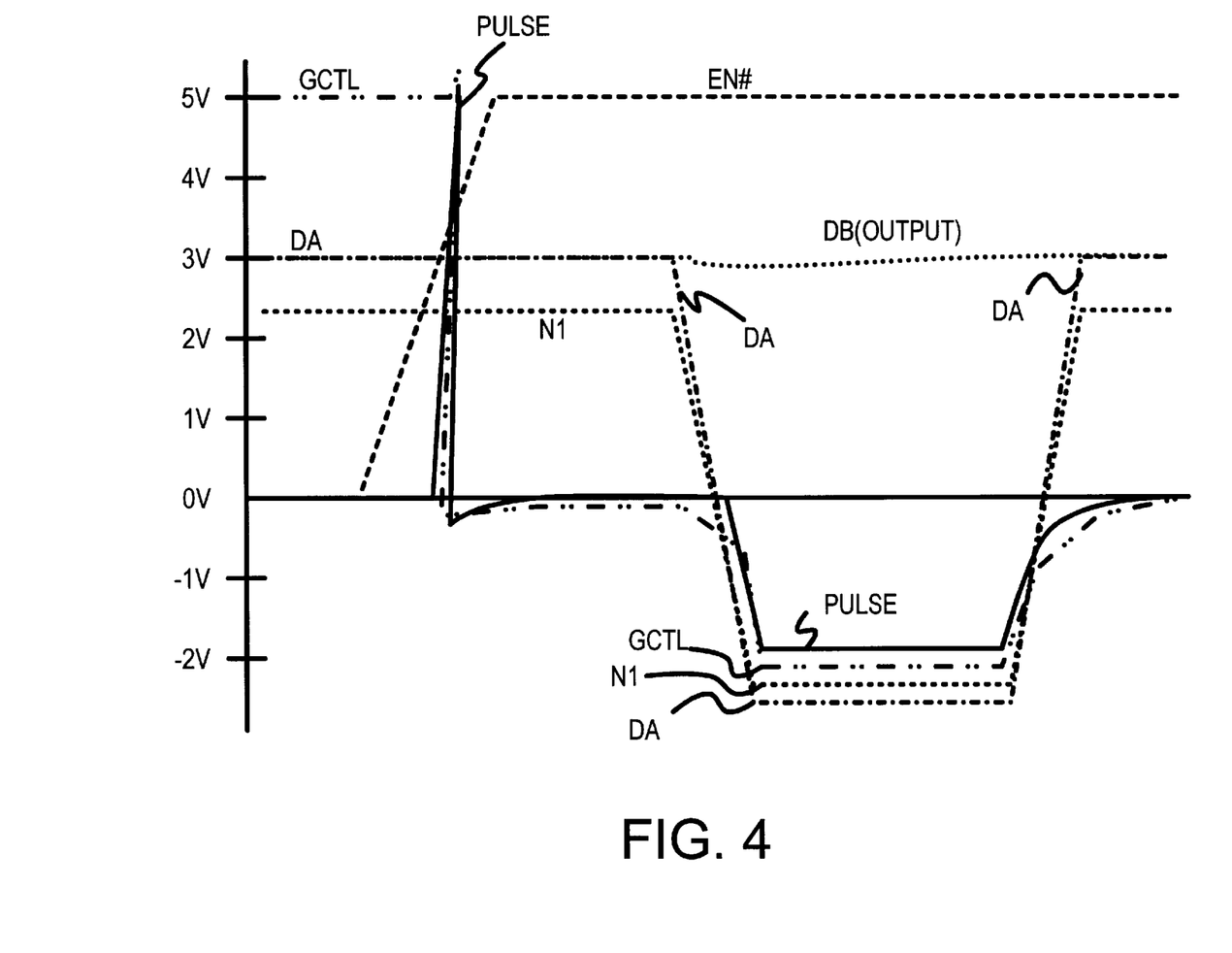
FIG. 4 shows a simulated waveform of an undershoot on the bus switch of FIG. 3.

FIG. 4 shows a simulated waveform of an undershoot on the bus switch of FIG. 3. DA is the active bus, so direction signal DA2B is high (not shown) throughout the waveform. When isolation signal EN# goes from low to high, isolation mode is entered. A high-going pulse is generated on node PULSE during the EN# transition. Although narrow, this pulse is sufficient to drive gate node GCTL from high to ground. Even though GCTL goes low, node N1 remains at an intermediate 2.4 volts since it is connected to bus DA by the connecting transistor or is isolated.

Bus signals DA and DB remain high, at about 3 volts. Then an undershoot occurs on bus DA, the input. In this simulation, the undershoot goes to −2.5 volts. Node N1 is pulled low to about −2 volts by connecting transistor 60 from bus DA, coupling the undershoot to node N1. Node PULSE is pulled low to about −2 volts by grounded-gate transistor 64 from node N1. Likewise, gate node GCTL is also pulled low to about −2 volts by grounded-gate transistor 56 from node N1.

The difference in voltage from gate node GCTL to the source (bus DA) remains small during the undershoot, perhaps reaching a maximum of 0.3 volts. Since 0.3 volts is much less than the transistor threshold of 0.5–0.7 volt, bus switch transistor 30 does not turn on. Consequently, bus DB remains isolated from the undershoot on bus DA. Only a very slight dip from 3 volts occurs on bus DB at the beginning of the undershoot. Despite the long duration of the simulated undershoot, the isolated bus DB is not disturbed. Isolation is maintained despite a long undershoot.

Figure 5:
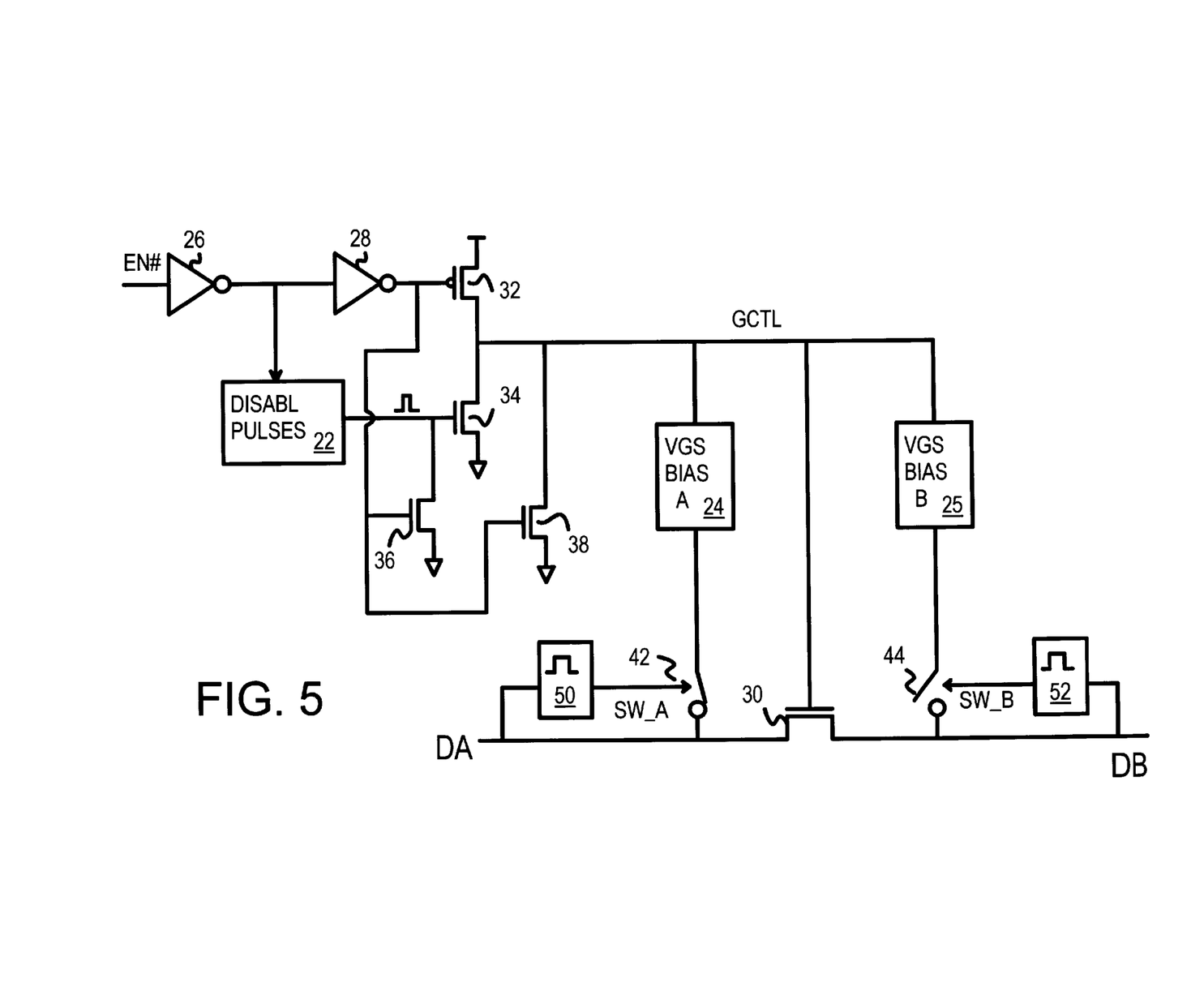
FIG. 5 is a block diagram of a bus switch with undershoot protection that uses bus-sensing that triggers a protecting pulse.

Pulsed Protection Using Sensing—FIG. 5

FIG. 5 is a block diagram of a bus switch with undershoot protection that uses bus-sensing that triggers a protecting pulse. Only one external control signal is needed, the isolation signal EN#, which is low when bus switch transistor 30 connects bus signal DA to bus signal DB. Isolation signal EN# goes high when bus switch transistor 30 is to isolate bus signals DA, DB. Isolation occurs by turning off bus switch transistor 30 by driving a low to gate-control node GCTL, which is the gate of bus switch transistor 30.

In this embodiment, the other control signal (direction signal DA2B) is not needed. Instead, sense-pulse circuit 50 senses bus signal DA for low-going transitions. When bus signal DA goes from high to low, and undershoot could occur. Pulse-sense circuit 50 then generates a pulse that activates gate-bias circuit 24 and closes switch 42. This allows gate-bias circuit 24 to couple any undershoot that occurs on bus DA to gate node GCTL, ensuring that bus switch transistor 30 does not turn on. Once the pulse ends, switch 42 is opened again and gate-bias circuit 24 is disabled.

A second pulse-sense circuit 52 is attached to bus signal DB, and operates in a similar manner, closing switch 44 and activating gate-bias circuit 25 when a low-going transition occurs on bus DB.

When enabled during an undershoot below ground, gate-bias circuits 24, 25 drive gate node GCTL below ground with the lower voltage of the undershoot. This prevents the gate-to-source voltage of bus switch transistor 30 from rising above the transistor threshold voltage. Bus switch transistor 30 is therefore prevented from turning on during the undershoot.

For example, when isolation signal EN# is high and a low-going transition occurs on bus DB, switch 44 is closed and gate-bias circuit 25 is enabled. Switch 42 remains open and gate-bias circuit 24 remains disabled. Gate-bias circuit 25 then couples the undershoot voltage to gate node GCTL, driving the gate voltage below ground. The gate-to-source voltage of bus switch transistor 30 is then limited to prevent turn-on.

When isolation mode begins, isolation signal EN# is driven from low to high and inverted by inverters 26, 28. A high-going pulse is generated by pulse generator 22, which drives the gate of discharge transistor 34. The gate node GCTL is discharged to ground by discharge transistor 34, thus turning off bus switch transistor 30, isolating bus DA from bus DB. The high isolation signal EN# turns off p-channel pullup transistor 32 that normally drives a high onto gate node GCTL when bus switch transistor 30 is enabled.

Keeper transistors 36, 38 have their gates driven high by inverter 28 when isolation signal EN# is high. Keeper transistor 36 keeps the gate of discharge transistor 34 low after the pulse ends, while keeper transistor 38 keeps gate node GCTL at ground when no undershoots occur during isolation. Keeper transistors 36, 38 have long channel lengths so that other active transistors can overpower them, such as the transistors in gate-bias circuit 24 that drive gate node GCTL below ground during an undershoot.

Figure 6:
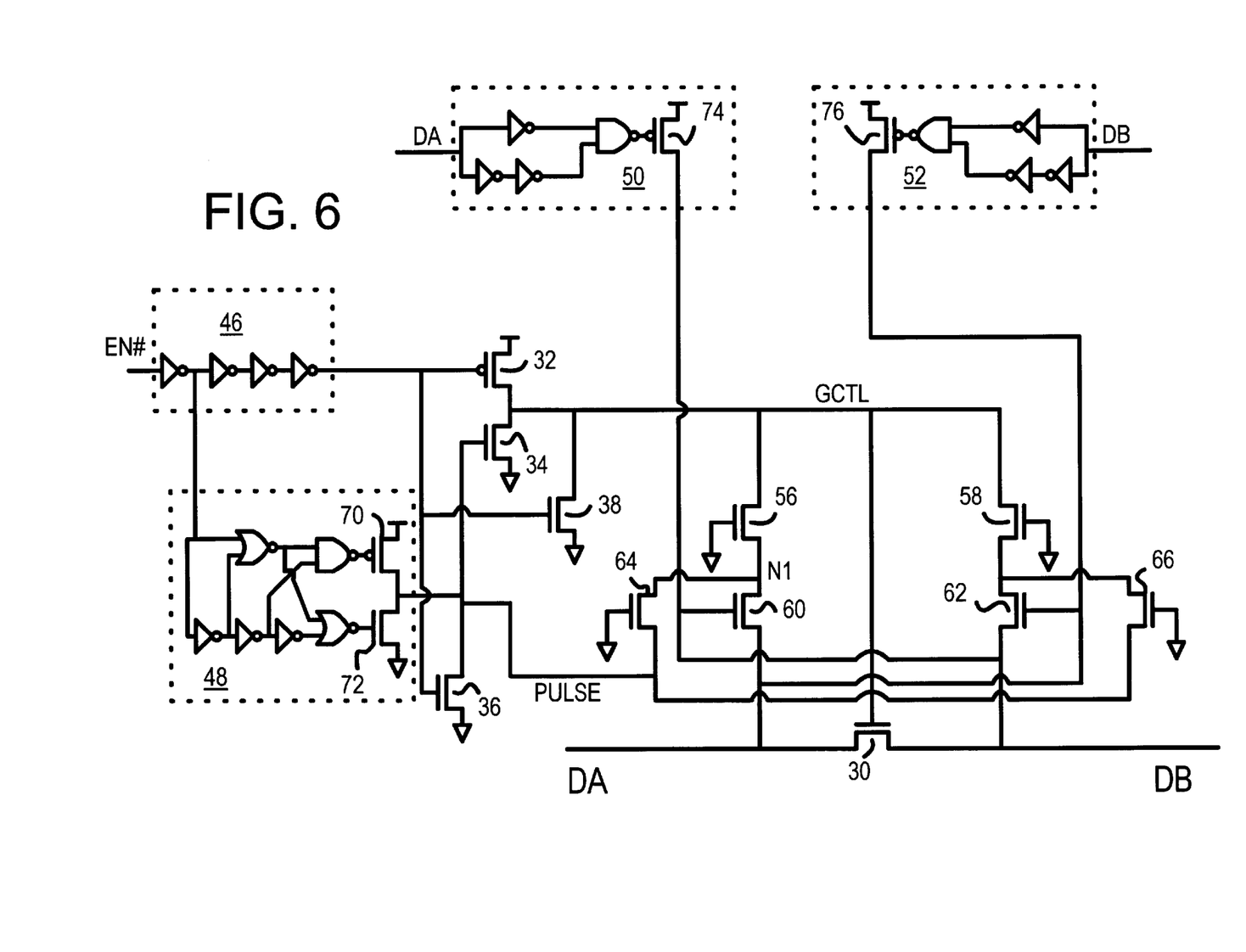
FIG. 6 is a detailed schematic of a bus switch with undershoot protection using sense-pulse circuits.

FIG. 6 is a detailed schematic of a bus switch with undershoot protection using sense-pulse circuits. Bus signal DA is connected to bus signal DB through the channel of bus switch transistor 30. When the bus switch is enabled, isolation signal EN# is low and four inverters 46 drive a low to the gate of p-channel pullup transistor 32. Gate node GCTL is driven high by p-channel pullup transistor 32. Keeper transistors 36, 38 are held off by four inverters 46. Grounded-gate n-channel transistors 56, 58 are turned off when gate node GCTL is high. Thus gate node GCTL is driven only by p-channel pullup transistor 32 when isolation signal EN# is low and bus switch transistor 30 is enabled.

For most of the time, NAND gates in sense-pulse circuits 50, 52 output a high to the gates of p-channel transistors 74, 76, turning them off. While connecting n-channel transistors 60, 62 turn on when DA or DB is high, their drains are isolated from other circuitry by grounded-gate n-channel transistors 56, 58, 64, 66.

When isolation mode is entered, isolation signal EN# goes high. Four inverters 46 drives a high to the gate of p-channel pullup transistor 32, turning it off. Keeper transistors 36, 38 are turned on, providing a low-current sink on gate node GCTL and pulse node PULSE.

Pulse generator 48 generates a high-going pulse on node PULSE, using p-channel pullup 70 and n-channel pulldown 72. This pulse turns on n-channel discharge transistor 34, which pulls gate node GCTL to ground. This turns off bus switch transistor 30, isolating bus DA from bus DB. Once the pulse ends, keeper transistor 38 keeps gate node GCTL at ground despite any leakage currents. The pulse on node PULSE is not passed through grounded-gate transistors 64, 66 even though the pulse is applied to their drains.

When a high-to-low transition occurs on one of buses DA, DB, the NAND gates in one of sense-pulse circuits 50, 52 generate a low-going pulse to one of p-channel transistors 74, 76. One of p-channel transistors 74, 76 is turned on, enabling undershoot protection. Furthermore transistors 74, 76 are weak pull-ups. They will not interfere with normal bus activities when enabled.

For example, when a low-going transition occurs on bus DA, the NAND gate in sense-pulse circuit 50 outputs a low pulse to p-channel transistor 74, turning it on for a short time. P-channel transistor 76 remains off. P-channel transistor 74 has its drain connected to bus signal DB, and acts as a pullup for the inactive bus signal DB. Also, the drain of p-channel transistor 74 is connected to the gate of n-channel connecting transistor 60, turning on the connecting transistor. This enables the undershoot protection circuit for the active bus DA, while the undershoot protection for bus DB is off.

When an undershoot below ground occurs on active bus DA during the pulse from sense-pulse circuit 50, the left side of bus switch transistor 30 becomes its source.

Connecting transistor 60 is on, and couples the undershoot to node N1. Grounded-gate transistor 56 then turns on, since its source is node N1, which is pulled below ground by the undershoot on DA coupled through connecting transistor 60. Grounded-gate transistor 56 then pulls gate node GCTL below ground. This keeps the gate-to-source voltage of bus switch transistor 30 from rising above the transistor threshold of about 0.5 volt. Grounded-gate transistors 64, 66 can also turn on, pulling node PULSE below ground. Thus coupled the undershoot to node PULSE, preventing discharge transistor 34 from turning on. In addition, keeper transistor 38 will not disturb the negative potential acquired by node GCTL during the duration of the undershoot transient since it is a weak pull-down. Furthermore, the connecting transistor 62 is also held off by p-channel transistor 76, thus the undershoot is not coupled to bus DB. Isolation is maintained during the undershoot on bus DA.

When the undershoot ends, the current through grounded-gate transistor 56 reverses direction. Gate node GCTL is charged back up toward ground through grounded-gate transistor 56 and connecting transistor 60 as bus DA ends the undershoot and returns to ground. Once gate node GCTL is at −0.5 volt, grounded-gate transistor 56 shuts off. Keeper transistor 38 then conducts current in a reverse direction by sourcing current from ground until gate node GCTL reaches ground.

The substrate of all n-channel transistors is preferably connected to a back bias, such as −2 or −3 volt. This enhances undershoot protection. The width of the pulse generated by sense-pulse circuits 50, 52 can be small, 5–10 nanoseconds, since the undershoot is usually generated by the low-going transition that sense-pulse circuit 50, 52 detects. Large undershoots do not normally occur in the absense of a low-going transition.

Figure 7:
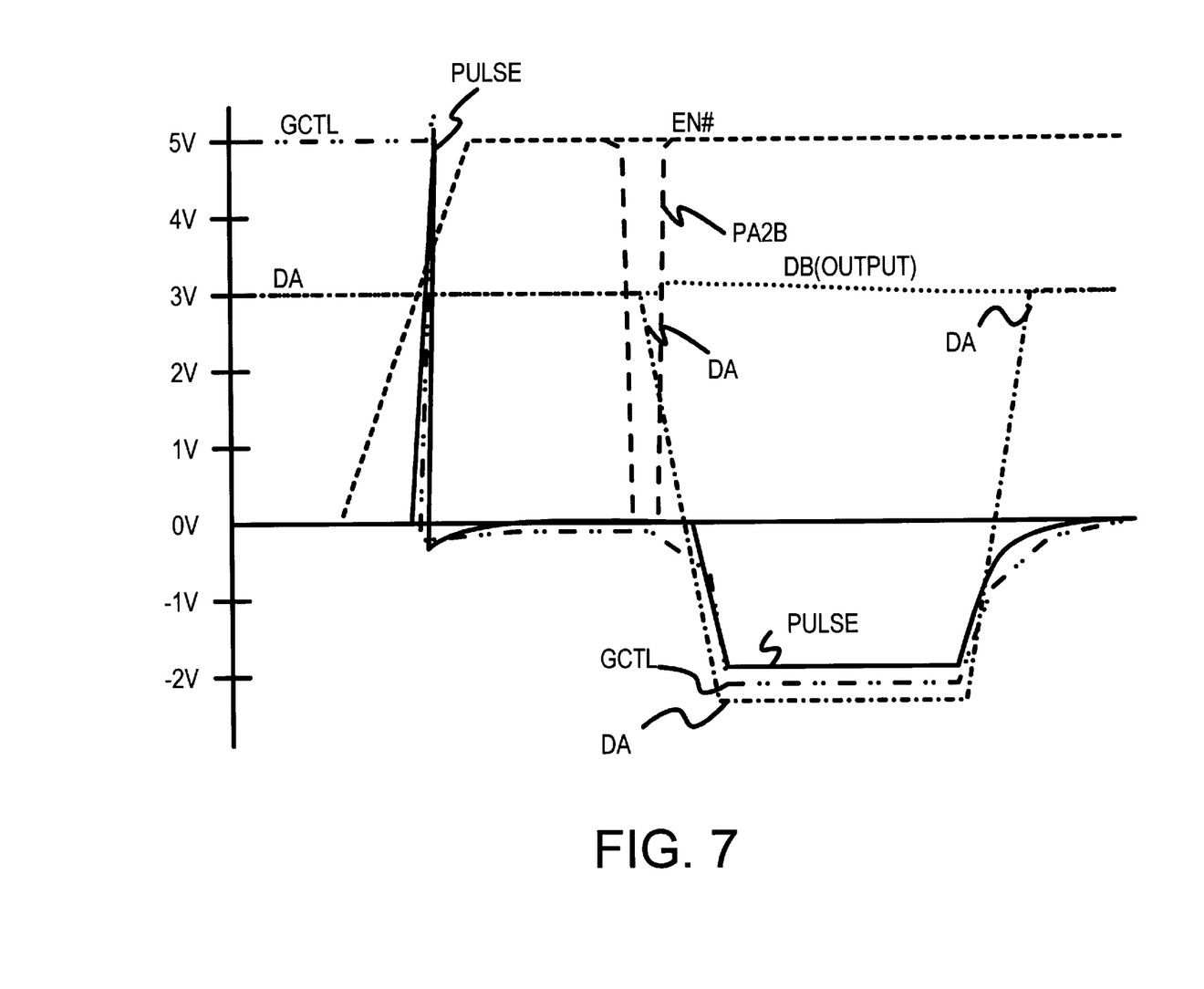
FIG. 7 shows a simulated waveform of an undershoot on the bus switch of FIG. 6.

FIG. 7 shows a simulated waveform of an undershoot on the bus switch of FIG. 6.

In this simulation, the undershoot occurs on the DA bus. When isolation signal EN# goes from low to high, isolation mode is entered. A high-going pulse is generated on node PULSE during the EN# transition. Although narrow, this pulse is sufficient to drive gate node GCTL from high to ground.

Bus signals DA and DB remain high, at about 3 volts. When bus DA goes from high to low, the sense-pulse circuit generates the low-going pulse PA2B. The pulse PA2B activates the undershoot-protection circuit for bus DA. Then as bus signal DA continues to fall below ground an undershoot occurs while the pulse PA2B is still active. In this simulation, the undershoot goes to −2.5 volts. Node N1 is pulled low to about −2 volts by connecting transistor 60 from bus DA, coupling the undershoot to node N1. Node PULSE is pulled low to about −2 volts by grounded-gate transistor 64 from node N1. Likewise, gate node GCTL is also pulled low to about −2 volts by grounded-gate transistor 56 from node N1.

The difference in voltage from gate node GCTL to the source (bus DA) remains small 15 during the undershoot, perhaps reaching a maximum of 0.3 volts. Since 0.3 volts is much less than the transistor threshold of 0.5–0.7 volt, bus switch transistor 30 does not turn on. Consequently, bus DB remains isolated from the undershoot on bus DA. Only a very slight bounce from 3 volts occurs on bus DB at the beginning of the undershoot. Despite the long duration of the simulated undershoot, the isolated bus DB is not disturbed. Isolation is maintained despite a long undershoot.

ADVANTAGES OF THE INVENTION

A fully bi-directional bus switch uses CMOS technology. Protection from undershoots on the input or the output side is provided when the bus switch is isolating its output from its input. The active undershoot-protection circuit uses CMOS transistors. The low on-resistance and low capacitance of the bus switch is maintained. A more fully-isolating and bi-directional bus switch is achieved.

Applications that generate a directional DA2B signal can use that signal to enable one side or the other for undershoot protection. Applications without a directional control signal can still use the invention by employing sense-pulse circuits. The sense-pulse circuits activate undershoot protection during low-going pulses.

ALTERNATE EMBODIMENTS

Several other embodiments are contemplated by the inventors. For example the invention can be reversed for use with p-channel bus-switch transistors. Overshoot as well as undershoot protection could be provided. The invention can be applied to non-standard processes such as silicon-on-insulator (SOI). A p-channel transistor can be added in parallel to the n-channel bus-switch transistor to create a full-CMOS bus switch. The protection circuit for the n-channel bus-switch transistor is still effective. The sense-pulse circuits could be modified to be enabled only during isolation mode by the addition of an enable-signal input to a logic gate in the sense-pulse circuit, or by other methods. Other transistors, resistors, or capacitors may be added in parallel or in series in several locations the circuits. Instead of a single direction control, an additional control input can be added so that each direction-control input can enable the protection circuit independently.

A pullup p-channel transistor can be added to either bus, as can a pullup resistor. A pullup resistor can also be added in series with a p-channel pullup transistor. The terms source and drain can be considered interchangeable, depending on the current voltages applied. Likewise, the input and output of the bus switch can be reversed or interchanged for bi-directional bus switches. Many other pulse-generator circuits such as NAND-based or NOR-based circuits can be substituted. Parasitic capacitances may be used rather than an explicit capacitor for the delay in the pulse generator.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An undershoot-protected bus switch comprising:
    a bus switch transistor for connecting a first bus to a second bus in response to a gate node;
    an enable input for indicating an isolation mode when the bus switch transistor should dis-connect the first bus from the second bus;
    an activating transistor, responsive to the enable input, for driving an activating voltage onto the gate node, the activating voltage causing the bus switch transistor to connect the first bus to the second bus;
    a pulse generator, coupled to the enable input, for generating a disable pulse when the enable input transitions to indicate the isolation mode;
    a discharge transistor, responsive to the disable pulse, for driving a disabling voltage onto the gate node, the disabling voltage causing the bus switch transistor to isolate the first bus from the second bus;
    a first bias circuit, coupled between the first bus and the gate node, for coupling an undershoot from the first bus to the gate node during the isolation mode; and a second bias circuit, coupled between the second bus and the gate node, for coupling an undershoot from the second bus to the gate node during the isolation mode, whereby the undershoot from either the first bus or the second bus is coupled to the gate node during the isolation mode.

2. The undershoot-protected bus switch of claim 1 further comprising:

a first keeper transistor, coupled to the gate node, for providing a leakage-countering current to the gate node during the isolation mode to maintain the disabling voltage when no undershoot is occurring, whereby the disabling voltage is maintained despite leakage.

3. The undershoot-protected bus switch of claim 1 wherein the first bias circuit comprises:

a first connecting transistor for conducting current between the first bus and a first intermediate node during the undershoot on the first bus;

a first fixed-gate transistor, coupled between the first intermediate node and the gate node, for conducting current between the first intermediate node and the gate node during the undershoot on the first bus;

wherein the second bias circuit comprises:

a second connecting transistor for conducting current between the second bus and a second intermediate node during the undershoot on the second bus; and a second fixed-gate transistor, coupled between the second intermediate node and the gate node, for conducting current between the second intermediate node and the gate node during the undershoot on the second bus, whereby the connecting and fixed-gate transistors couple the undershoot from the respective bus to the gate node of the bus switch transistor.

4. The undershoot-protected bus switch of claim 3 wherein the first fixed-gate transistor and the second fixed-gate transistor are n-channel transistors with gates connected to ground.

5. The undershoot-protected bus switch of claim 4 wherein the first connecting transistor in the first bias circuit has a gate coupled to the second bus;

wherein the second connecting transistor in the second bias circuit has a gate coupled to the first bus, whereby opposite sides of the bus switch transistor control the connecting transistors in the first and second bias circuits.

6. The undershoot-protected bus switch of claim 5 further comprising:

a second activating transistor for driving a second activating voltage onto the gate of the first connecting transistor, the second activating voltage enabling the first conducting transistor to conduct the undershoot from the first bus; and a third activating transistor for driving a third activating voltage onto the gate of the second connecting transistor, the third activating voltage enabling the second conducting transistor to conduct the undershoot from the second bus, whereby the first and second bias circuits are enabled by the second and third activating voltages.

7. The undershoot-protected bus switch of claim 6 wherein the second and third activating transistors are p-channel transistors with sources connected to a power supply;

wherein the first and second connecting transistors are n-channel transistors, wherein the bus switch transistor is an n-channel metal-oxide-semiconductor (MOS) transistor having a source connected to the first bus and a drain connected to the second bus.

8. The undershoot-protected bus switch of claim 7 further comprising:

a first sense-pulse circuit, receiving the first bus as an input, for generating a pulse to enable the second activating transistor to enable the first bias circuit when a low-going transition is detected on the first bus; and a second sense-pulse circuit, receiving the second bus as an input, for generating a pulse to enable the third activating transistor to enable the, second bias circuit when a low-going transition is detected on the second bus, whereby undershoot protection is enabled when the low-going transition is detected on either the first or second bus.

9. The undershoot-protected bus switch of claim 7 further comprising:

a direction input that indicates when the first bus is active;

a first logic gate, responsive to the direction input and coupled to drive a gate of the second activating transistor, for enabling the second activating transistor when the direction input indicates that the first bus is active during the isolation mode; and a second logic gate, responsive to the direction input and coupled to drive a gate of the third activating transistor, for enabling the third activating transistor when the direction input indicates that the second bus is active during the isolation mode, whereby the direction input determines which of the first and second bias circuits is activated during the isolation mode.

10. The undershoot-protected bus switch of claim 9 wherein a gate of the discharge transistor is a discharge-pulse node that receives the disable pulse from, the pulse generator;

wherein the first bias circuit further comprises:

a third fixed-gate transistor, coupled between the first intermediate node and the discharge-pulse node, for coupling the undershoot from the first bus to the discharge-pulse node; and wherein the second bias circuit further comprises:

a fourth fixed-gate transistor, coupled between the second intermediate node and the discharge-pulse node, for coupling the undershoot from the second bus to the discharge-pulse node, whereby the undershoot from either bus is also coupled to the discharge-pulse node to prevent the discharge transistor from turning on during the undershoot.

11. The undershoot-protected bus switch of claim 10 wherein the third and fourth fixed-gate transistors are n-channel transistors with grounded gates.

12. The undershoot-protected bus switch of claim 11 further comprising:

a second keeper transistor, coupled to the discharge-pulse node, for providing a leakage-countering current to the discharge-pulse node during the isolation mode when no undershoot is occurring, whereby leakage in the discharge-pulse node is countered to prevent the discharge transistor from turning on.

13. A bi-directional-undershoot-protected bus switch comprising:
- a first bus input connected to a first bus;
- a second bus input connected to a second bus;
- a bus switch transistor having a source connected to the first bus input and a drain connected to the second bus input and a gate connected to a gate node;
- a first connecting transistor, having a source connected to the first bus input and a drain connected to a first intermediate node, for connecting the first bus input to the first intermediate node in response to a first activating signal applied to a first activating node connected to a gate of the first connecting transistor;
- a first fixed-gate transistor, having a source connected to the first intermediate node and a drain connected to the gate node and a gate connected to a fixed voltage, for connecting the first intermediate node to the gate node during an undershoot on the first bus input;
- a second connecting transistor, having a source connected to the second bus input and a drain connected to a second intermediate node, for connecting the second bus input to the second intermediate node in response to a second activating signal applied to a second activating node connected to a gate of the second connecting transistor;
- a second fixed-gate transistor, having a source connected to the second intermediate node and a drain connected to the gate node and a gate connected to the fixed voltage, for connecting the second intermediate node to the gate node during an undershoot on the second bus input;
- a first activating transistor having a drain connected to the first activating node, for generating the first activating signal to protect from the undershoot on the first bus input;
- a second activating transistor having a drain connected to the second activating node, for generating the second activating signal to protect from the undershoot on the second bus input;
- an enable input for indicating an isolation mode when the bus switch transistor isolates the first bus input from the second bus input;
- a pullup transistor having a gate responsive to the enable input, for driving the gate node high when the isolation mode is not active; and
- a discharge transistor for driving the gate node low when the isolation mode begins, whereby the bus switch transistor is protected from the undershoot on either the first or second bus input.

14. The bi-directional-undershoot-protected bus switch of claim 13 wherein the first and second fixed-gate transistors are n-channel transistors with gates connected to ground, wherein the fixed voltage is ground, whereby the fixed-gate transistors couple the respective undershoot to the gate node.

15. The bi-directional-undershoot-protected bus switch of claim 14 wherein the first and second connecting transistors are n-channel transistors;
- wherein the first activating transistor is a p-channel transistor having a drain connected to the first activating node and a source connected to a power supply and a gate connected to a first trigger node; and
- wherein the second activating transistor is a p-channel transistor having a drain connected to the second activating node and a source connected to the power supply and a gate connected to a second trigger node,
- whereby the p-channel transistors generate the first and second activating signals.

16. The bi-directional-undershoot-protected bus switch of claim 15 further comprising:
- a first sense-pulse circuit coupled to the first bus input, for generating a pulse on the first trigger node in response to a low-going transition on the first bus input; and
- a second sense-pulse circuit, coupled to the second bus input, for generating a pulse on the second trigger node in response to a low-going transition on the second bus input,
- whereby undershoot protection is triggered by the low-going transition on either the first or second bus input.

17. The bi-directional-undershoot-protected bus switch of claim 15 further comprising:
- a direction input that indicates when the first bus input is active and the second bus input is inactive;
- a first logic gate, receiving the direction input and the enable input, for driving the first trigger node; and
- a second logic gate, receiving the direction input and the enable input, for driving the second trigger node;
- wherein the direction input disables either the first activating transistor or the second activating transistor,
- whereby undershoot protection is enabled by the activating transistor selected by the direction input.

18. The bi-directional-undershoot-protected bus switch of claim 17 wherein the first activating node is connected to the second bus input;
- wherein the second activating node is connected to the first bus input,
- whereby the first activating transistor pulls up the second bus input in response to the first trigger node and whereby the second activating transistor pulls up the first bus input in response to the second trigger node.

19. The bi-directional-undershoot-protected bus switch of claim 18 wherein substrates of all the n-channel transistors are connected to a negative bias below ground.

20. A buss switch comprising:
- a first bus input;
- a second bus input;
- bus switch transistor means for conducting current between the first bus input and the second bus input in response to a gate connected to a gate node;
- first connecting transistor means for conducting current between the first bus input and a first intermediate node in response to the second bus input connected to a gate of the first connecting transistor means;
- first fixed-gate transistor means, having a gate connected to a fixed voltage, for conducting current between the first intermediate node and the gate node during an undershoot on the first bus input;
- second connecting transistor means for conducting current between the second bus input and a second intermediate node in response to the first bus input connected to a gate of the second connecting transistor means;

second fixed-gate transistor means, having a gate connected to the fixed voltage, for conducting current between the second intermediate node and the gate node during an undershoot on the second bus input;

an enable input for indicating an isolation mode when the bus switch transistor means isolates the first bus input from the second bus input;

pullup transistor means, having a gate responsive to the enable input, for driving the gate node high when the isolation mode is not active;

discharge-pulse means, responsive to the enable input entering the isolation mode, for generating a discharge pulse; and discharge transistor means, receiving the discharge pulse from the discharge-pulse means, for driving the gate node low when the isolation mode begins, whereby the bus switch transistor means is protected from the undershoot on either the first or second bus input.

* * * * *